(12) United States Patent
Bieg et al.

(10) Patent No.: US 8,687,169 B2
(45) Date of Patent: Apr. 1, 2014

(54) OPTICAL APERTURE DEVICE

(75) Inventors: Hermann Bieg, Huettlingen (DE);
Uy-Liem Nguyen, Zurich (CH)

(73) Assignee: Carl Zeiss SMT GmbH, Oberkocken (DE)

( * ) Notice: Subject to any disclaimer, the term of this patent is extended or adjusted under 35 U.S.C. 154(b) by 144 days.

(21) Appl. No.: 12/894,890

(22) Filed: Sep. 30, 2010

(65) Prior Publication Data
US 2011/0063595 A1    Mar. 17, 2011

Related U.S. Application Data

(63) Continuation of application No. PCT/EP2008/054433, filed on Apr. 11, 2008.

(51) Int. Cl.
*G03B 27/72* (2006.01)
*G03B 27/54* (2006.01)

(52) U.S. Cl.
USPC .............................................. 355/71; 355/67

(58) Field of Classification Search
None
See application file for complete search history.

(56) References Cited

U.S. PATENT DOCUMENTS

| | | | |
|---|---|---|---|
| 3,688,655 A | 9/1972 | Klostermann et al. | |
| 5,311,249 A | 5/1994 | Kamon et al. | |
| 6,538,723 B2* | 3/2003 | Hagiwara et al. | 355/67 |
| 2003/0002022 A1 | 1/2003 | Schultz | |
| 2003/0043352 A1 | 3/2003 | Sudoh et al. | |
| 2004/0104359 A1* | 6/2004 | Komatsuda et al. | 250/492.2 |
| 2007/0211352 A1* | 9/2007 | Phillips et al. | 359/738 |
| 2007/0252966 A1* | 11/2007 | Shirata | 355/67 |
| 2008/0173789 A1* | 7/2008 | Minoda | 250/205 |

FOREIGN PATENT DOCUMENTS

| | | |
|---|---|---|
| JP | 2003-506881 | 2/2003 |
| JP | 2007-243182 | 9/2007 |
| WO | WO 2007/105549 | 9/2007 |

OTHER PUBLICATIONS

International Search Report dated Jan. 15, 2009, for corresponding PCT Application No. PCT/EP2008/054433, filed Apr. 11, 2008.
International Preliminary Report on Patentability for corresponding PCT Application No. PCT/EP2008/054433, dated Oct. 12, 2010.
Japanese Office Action, with English translation, for corresponding JP Appl No. 2011-503342, dated Jul. 6, 2012.

* cited by examiner

*Primary Examiner* — Peter B Kim
*Assistant Examiner* — Michelle Iacoletti
(74) *Attorney, Agent, or Firm* — Fish & Richardson P.C.

(57) ABSTRACT

An optical module includes an aperture device and a support structure supporting the aperture device. The aperture device defines an aperture edge and an aperture plane. The aperture edge is adapted to define a geometry of a light beam passing the aperture device along an optical axis. The support structure is adapted to hold the aperture device in a defined manner when the aperture plane is inclined with respect to a horizontal plane. A temperature distribution prevails within the aperture device and at least one of the aperture device and the support structure is adapted to maintain at least one of a relative position of the aperture edge with respect to the optical axis and a geometry of the aperture edge substantially unaltered upon an introduction of a thermal energy into the aperture device, where the thermal energy being adapted to cause an alteration in the temperature distribution.

26 Claims, 5 Drawing Sheets

OPTICAL APERTURE DEVICE

CROSS-REFERENCE TO RELATED APPLICATIONS

This application is a continuation of, and claims benefit under 35 USC 120 to, international application PCT/EP2008/054433, filed Apr. 11, 2008, the entire contents of which are hereby incorporated by reference.

FIELD

The disclosure relates to an optical module that may be used within an optical device used in exposure processes, in particular in microlithography systems. It also relates to an optical imaging arrangement including such an optical module. It further relates to a method of shaping a bundle of light beam used within such an optical device. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element modules including optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units. Further components of such optical systems are aperture devices defining the geometry of the light beam used in the exposure process.

Due to the ongoing miniaturization of semiconductor devices there is a desire for enhanced resolution of the optical systems used for fabricating those semiconductor devices. One possibility to enhance resolution of the optical systems is to reduce the wavelength of light used in the exposure process. Thus, there currently is a strong tendency to use light in the so-called extreme UV (EUV) range at wavelengths between about 5 to 20 nm, typically at about 13 nm. However, in this EUV range the use of refractive optical element may not be possible any more due to the high absorption of light of such a short wavelength within any medium, in particular within refractive optical elements.

Consequently, not only exclusively reflective optical systems are used in such an EUV system but also a highly evacuated atmosphere has to be maintained within the part of the light used in the exposure process. Due to the limitations in increasing the radiant power of the EUV light fed into the optical exposure system (e.g. due to increasingly hard to handle heating effects etc) and the extremely high sensitivity of the EUV light to absorption care has to be taken to lose as few radiant power as possible all the way down to the substrate to be exposed.

One problem arising in this context is the loss of radiant power at aperture devices located within the path of the exposure light. In some cases, for example, it may be favorable (e.g. for a sigma variation) to have an aperture device which is able to provide variable annular settings. Typically, in non EUV systems, such annular settings are provided by a solid aperture plate (e.g. made of quartz) having a shielding outer section and a shielding inner section separated by a ring shaped transparent section allowing the light to pass the aperture. However, in an EUV system such an aperture plate may obviously not be used any more for reasons of absorption.

A solution could be to provide the aperture plate with corresponding cutouts in the region of the aperture such that only a few strut elements remain to radially connect the inner shielding section to the outer shielding section. However, such radial struts typically could also obstruct the path of the light through the aperture leading to an unwanted loss in radiant power.

A further problem arises in the context of providing varying annular settings with such EUV systems. A variation of the annular setting typically also includes a variation of the inner contour delimiting the annular aperture. Typically, in non EUV systems, such a variation of the annular setting is provided by exchanging the aperture plate with a different aperture plate providing the desired setting. However, in an EUV system (with its strict desired properties with respect to the high degree of evacuation and the low degree of contamination of the atmosphere in the path of the exposure light) such an exchange of a rather large and bulky structure can represent a considerable challenge with respect to the complexity and accuracy of the handling mechanism, the maintenance of a high-quality atmosphere (high vacuum, low contamination etc) and the space involved.

It will be appreciated that a solution to the above problems in an EUV system would also be suitable and beneficial in a conventional non EUV system.

SUMMARY

In some embodiments, the disclosure to, at least to some extent, overcomes the above disadvantages and to provide a simple and reliable variation of an aperture.

In certain embodiments, the disclosure minimizes the loss in radiant power caused by an aperture device located in the path of the exposure light.

The disclosure is based on the teaching that it is possible to provide a simple and reliable variation of an aperture in an optical system while minimizing the loss in radiant power by providing the possibility to independently modify a position and/or an orientation of aperture elements of an aperture device with respect to each other in order to modify the geometry of the aperture.

Such a configuration has the advantage that, typically, to modify the geometry of the aperture (in contrast to the previously known exchange of the entire aperture plate) only a part of the plurality of aperture elements has to be adjusted which is obviously leading to a reduction in the mass to be actuated and, consequently, leading to a reduction of the complexity of the handling and actuating mechanism. In particular, it has also been found that even in a case where a larger number of handling or actuating devices has to be used these devices may be of less complicated design such that this advantage (less complex design) outweighs the drawbacks of having an increased number of such devices. Furthermore, the possibility to independently modify even single ones of the aperture elements increases the flexibility of the aperture device and leads to a reduction in the reaction time of the aperture device. Thus, faster setting changes may be achieved leading to an increase in the overall productivity of the system.

Furthermore, such a configuration has the advantage that it is possible to support these aperture elements in such a manner that (apart from the areas intentionally shielded by the aperture device to form the desired aperture geometry) they do not obstruct the path of the exposure light leading to a minimization of the loss in radiant power caused by the aperture device.

Thus, according to a first aspect of the disclosure there is provided an optical module including an aperture device. The aperture device includes a plurality of aperture elements defining a geometry of an aperture and including a first aperture element and a second aperture element. The aperture device is adapted to independently modify at least one of a position and an orientation of the first aperture element with respect to the second aperture element to modify the geometry of the aperture.

According to a second aspect of the disclosure there is provided an optical imaging arrangement including a mask unit adapted to receive a pattern, a substrate unit adapted to receive a substrate, an illumination unit adapted to illuminate the pattern and an optical projection unit adapted to transfer an image of the pattern onto the substrate. Each of the illumination unit and the optical projection unit includes a system of optical elements. At least one of the illumination unit and the optical projection unit includes an optical module including an aperture device. The aperture device includes a plurality of aperture elements defining a geometry of an aperture and including a first aperture element and a second aperture element. The aperture device is adapted to independently modify at least one of a position and an orientation of the first aperture element with respect to the second aperture element to modify the geometry of the aperture.

According to a third aspect of the disclosure there is provided a method of shaping a bundle of light including providing a bundle of light and a plurality of aperture elements, the plurality of aperture elements defining a geometry of an aperture and including a first aperture element and a second aperture element; shaping the bundle of light using the aperture; independently modifying at least one of a position and an orientation of the first aperture element with respect to the second aperture element to modify the geometry of the aperture shaping the bundle of light.

As had already been mentioned above, it has been found that it is possible to support the components of the aperture device according to the disclosure in such a manner that they do not obstruct the path of the exposure light leading to a minimization of the loss in radiant power caused by the aperture device.

Thus, according to a fourth aspect of the disclosure there is provided an optical module including an aperture device. The aperture device includes a plurality of aperture elements defining a geometry of an aperture and including a first aperture element and a second aperture element. The first aperture element, in one state of the aperture device, defines an inner contour of an aperture having a ring shaped geometry. The second aperture element, in the one state of the aperture device, defines an outer contour of the aperture. The aperture is adapted to be passed, in the one state of the aperture device, by a defined bundle of rays of light. The first aperture element is supported such that a path of the bundle of rays of light through the aperture is not obstructed.

It will be appreciated in this context that a ring shaped geometry, in the sense of the present disclosure, is not limited to a geometry having a circular inner and outer contour. Rather, any geometry having an arbitrarily shaped (e.g. at least partially straight and/or at least partially polygonal and/or at least partially curved) inner contour and an arbitrarily shaped (e.g. at least partially straight and/or at least partially polygonal and/or at least partially curved) outer contour is to be understood as a ring shaped geometry in the sense of the disclosure as long as the inner contour and the outer contour do not intersect or contact each other.

According to a fifth aspect of the disclosure there is provided an optical imaging arrangement including a mask unit adapted to receive a pattern, a substrate unit adapted to receive a substrate, an illumination unit adapted to illuminate the pattern and an optical projection unit adapted to transfer an image of the pattern onto the substrate. Each of the illumination unit and the optical projection unit includes a system of optical elements. At least one of the illumination unit and the optical projection unit further includes an optical module, the optical module including an aperture device including a plurality of aperture elements. The plurality of aperture elements define a geometry of an aperture and include a first aperture element and a second aperture element. The first aperture element, in one state of the aperture device, defines an inner contour of an aperture having a ring shaped geometry while the second aperture element, in the one state of the aperture device, defines an outer contour of the aperture. The aperture is adapted to be passed, in the one state of the aperture device, by a defined bundle of rays of light. The first aperture element is supported such that a path of the bundle of rays of light through the aperture is not obstructed.

According to a sixth aspect of the disclosure there is provided an optical module including an aperture device including a movable aperture element. The movable aperture element defines a geometry of an aperture and is movable from a first state to a second state. The movable aperture element in adapted to shield, in a first state, at least a part of an optically used surface of an optical element located adjacent to the aperture device from incident light propagating along a line of propagation. The movable aperture element has a plurality of recesses, at least one of the recesses, in the second state, being located such that the incident light propagating along the line of propagation hits the part of the optically used surface shielded in the first state.

All combinations of the features disclosed, whether explicitly recited in the claims or not, are within the scope of the disclosure.

BRIEF DESCRIPTION OF THE DRAWINGS

Further aspects and embodiments of the disclosure will become apparent from the dependent claims and the following description of preferred embodiments which refers to the appended figures, in which:

DETAILED DESCRIPTION OF THE DISCLOSURE

First Embodiment

In the following, a first preferred embodiment of an optical imaging arrangement 101 according to the disclosure will be described with reference to FIGS. 1 to 4.

Figure 1:
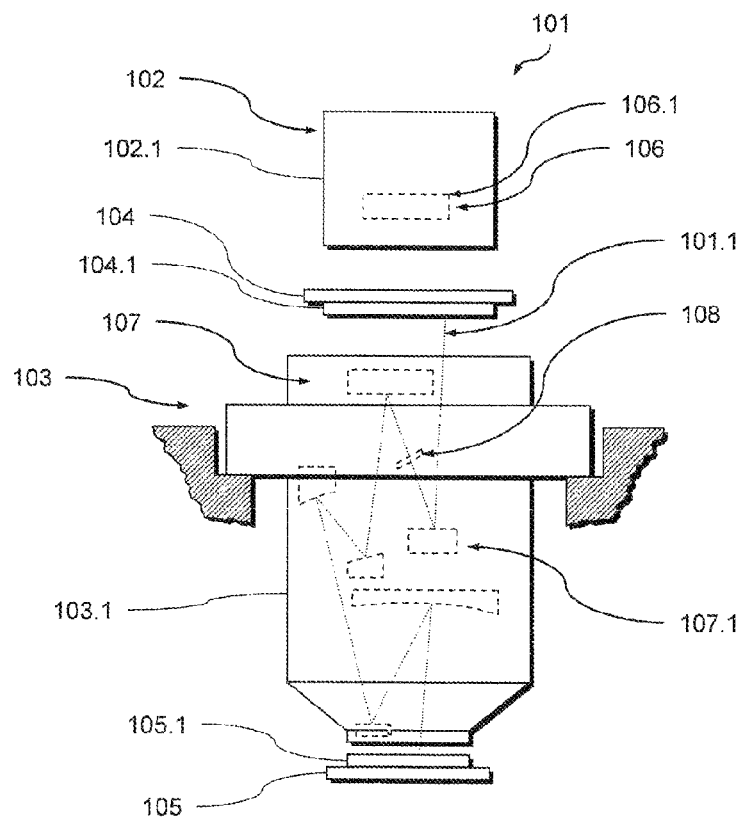
FIG. 1 is a schematic representation of a preferred embodiment of an optical imaging arrangement according to the disclosure which includes a preferred embodiment of an optical module according to the disclosure and with which preferred embodiments of methods according to the disclosure may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 includes a first optical device in the form of an illumination unit 102 and a second optical device in the form of an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The illumination unit 102 includes an optical element system 106 (only shown in a highly simplified manner in FIG. 1) including a plurality of optical element units such as optical element unit 106.1. As will be explained in further detail below, the optical element unit 106.1 is formed as a preferred embodiment of an optical module according to the disclosure. The optical projection unit 103 includes a further optical element system 107 including a plurality of optical element units 107.1. The optical element units of the optical element systems 106 and 107 are aligned along a folded optical axis 101.1 of the optical exposure apparatus 101.

In the embodiment shown, the optical exposure apparatus works with light in the EUV range at a wavelength between 5 nm to 20 nm, more precisely at a wavelength of 13 nm. Thus, the optical elements used within the illumination unit 102 and the optical projection unit 103 are exclusively reflective optical elements. However, it will be appreciated that, with other embodiments of the disclosure working at different wavelengths, any type of optical element (refractive, reflective or diffractive) may be used alone or in an arbitrary combination. The optical element system 107 may include a further optical module 108 according to the disclosure.

Figure 2:
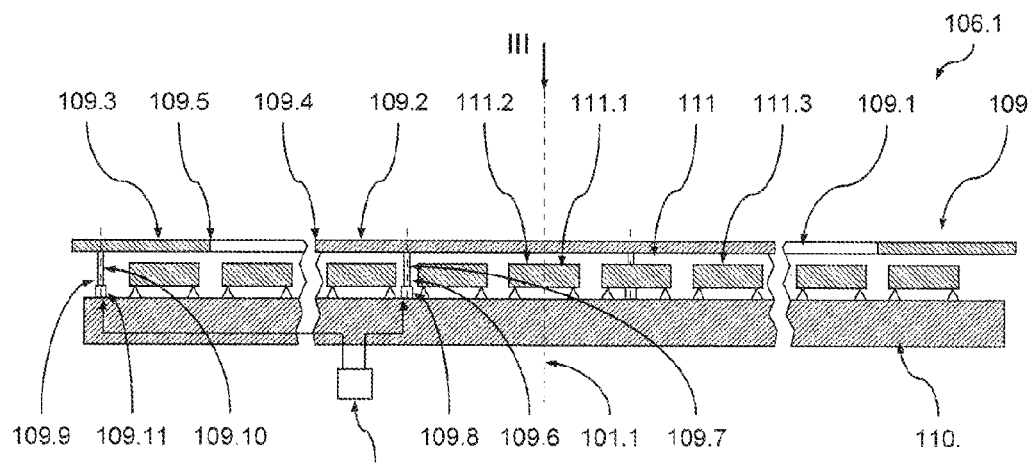
FIG. 2 is a schematic sectional representation of an optical module according to the disclosure being a part of the optical imaging arrangement of FIG. 1 (along line II-II of FIG. 3)
Figure 3:
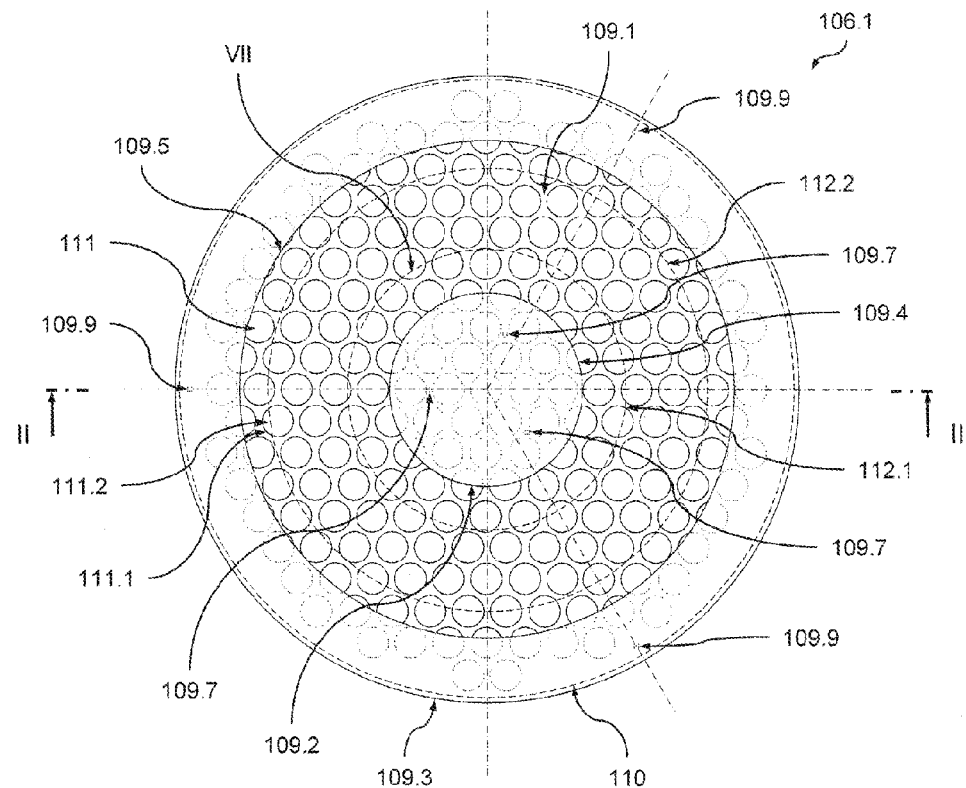
FIG. 3 is a schematic top view of the optical module of FIG. 2 along arrow III of FIG. 2.
Figure 4:
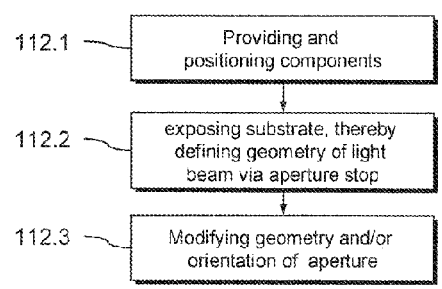
FIG. 4 is a block diagram of a preferred embodiment of a method of shaping a bundle of light which may be executed with the optical imaging arrangement of FIG. 1.

As can be seen from FIGS. 2 and 3, the optical module 106.1 includes an aperture device in the form of a aperture stop 109, a support structure 110 supporting the aperture stop 109 and an optical element 111 also supported by the support structure 110.

The optical element 111 is a reflective optical element, i.e. a mirror, formed by a plurality of separate mirror elements 111.1 each having a reflective partial surface 111.2 facing away from the support structure 110. The reflective partial surfaces 111.2 together form the reflective surface 111.3 of the optical element 111.

The mirror elements 111.1 are separately supported on the support structure 110 by any suitable mechanism (not shown in further detail). However, it will be appreciated that, with other embodiments of the disclosure, a monolithic optical element of any suitable type and design may be chosen as well.

The support structure 110, in the embodiment shown, is a simple plate shaped support which itself is supported (by a mechanism not shown in further detail) by the housing 102.1 of the illumination unit 102. However, it will be appreciated that, with other embodiments of the disclosure, the support structure may be of any suitable type and more or less sophisticated design. In particular, sophisticated cooling devices and/or actuating devices etc may be integrated into the support structure.

The aperture stop 109, in the state shown in FIGS. 2 and 3, defines an aperture 109.1 having a ring shaped geometry which is concentric to the optical axis 101.1. However, it will be appreciated that, with other embodiments of the disclosure, any other desired relative position of the aperture with respect to the optical axis may be chosen depending on the desired properties of the actual optical system.

The aperture stop 109 includes two separate aperture elements, namely an inner first aperture element of 109.2 and an outer second aperture element 109.3. The first aperture element 109.2 defines the inner contour 109.4 of the ring shaped aperture 109.1 while the second aperture element 109.3 defines the outer contour 109.5 of the ring shaped aperture 109.1.

The first aperture element 109.2 is a simple planar element of circular shape shielding a part of the reflective surface 111.3 of the mirror 111 from light incident along a line of propagation, e.g. along the optical axis 101.2. More precisely, the first aperture element 109.2 shields the part of the reflective surface 111.3 that is formed by the mirror elements 111.1 spanned by the first aperture element 109.2.

The second aperture element 109.3 includes a simple ring shaped shielding part also shielding a part of the reflective surface 111.3 of the mirror 111 from light incident along a line of propagation, e.g. along the optical axis 101.2. More precisely, the second aperture element 109.3 shields the part of the reflective surface 111.3 that is formed by the mirror elements 111.1 spanned by the second aperture element 109.3.

It will be appreciated that the aperture 109.1 formed by the first aperture element 109.2 and the second aperture element 109.3 may have any desired annular geometry. In particular, the inner contour of 109.4 and/or the outer contour 109.5 may have any desired (and least section wise curved and/or polygonal) geometry. For example, each one of these contour is does not necessarily have to be of circular shape. Furthermore, the inner contour of 109.4 and the outer contour 109.5 do not necessarily have to be concentric (i.e. they do not necessarily have to have coinciding area centers of gravity).

The first aperture element 109.2 is supported on the support structure 110 via a first support device 109.6 including a plurality of first support elements 109.7 and a plurality of first locking devices 109.8. Each of the first support elements 109.7 is formed as an elongated strut extending (in a direction parallel to the optical axis 101.1) within a lateral gap formed between adjacent mirror elements 111.1.

Each first support element 109.7 co-operates with an associated first locking device 109.8, each first locking device 109.8 releaseably locking the associated first support element 109.7 in place in at least one degree of freedom (DOF). Different first locking devices 109.8 restrict different degrees of freedom such that the first aperture element 109.2 is safely held in place in all six degrees of freedom. However, it will be appreciated that, with other embodiments of the disclosure, restriction in a different number of degrees of freedom may also be provided.

The second aperture element 109.3 is supported on the support structure 110 via a second support device 109.9 including a plurality of second support elements 109.10 and a plurality of second locking devices 109.11 distributed at the outer circumference of the support structure 110 and the mirror 111, respectively. Each of the second support elements 109.10 is formed as an elongated strut extending (in a direction parallel to the optical axis 101.1).

Each second support element 109.10 co-operates with an associated second locking device 109.11, each second locking device 109.11 releaseably locking the associated second support element 109.10 in place in at least one degree of freedom (DOF). Different second locking devices 109.10 restrict different degrees of freedom such that the second aperture element 109.3 is safely held in place in all six degrees of freedom. However, it will be appreciated that, with other embodiments of the disclosure, restriction in a different number of degrees of freedom may also be provided.

The first locking devices 109.8 and the second locking devices 109.11 may be of any suitable type and design to provide the desired restriction in the desired number of degrees of freedom. In particular, the respective locking device 109.8, 109.11 may use any suitable working principle providing a releasable connection between the support element 109.7 and the support structure 110. For example, mechanical working principles, electric working principles, magnetic working principles, fluidic working principles etc and arbitrary combinations thereof may be used.

Locking and release of the respective locking device 109.8 and 109.11 may be actively controlled via a control device 109.12 connected to each one of the respective locking devices 109.8 and 109.11. For example, a fluidic working principle, more precisely a pneumatic working principle may be used where the control device 109.12 establishes a negative pressure at a location of contact between the locking device 109.8, 109.11 and the associated support element 109.7, 109.10 providing the holding forces to hold the respective aperture element 109.2 and 109.3 in place.

However, with other embodiments of the disclosure, a self retaining mechanical solution may be chosen where a frictional and/or positive connection is provided between the locking device and the associated support element. In the most simple case a simple snap on connection may be used. However, preferably, some kind of actuator or the like is provided for the releasing action. This has the advantage that the support device does not have to be permanently energized (thus avoiding heating problems etc).

It will be further appreciated that, with other embodiments of the disclosure, such separate locking devices may (at least partially) be omitted and the respective aperture element may be held in place by the gravitational force acting on it and the frictional force resulting therefrom at the contact location between the respective support element and the supporting structure.

The releasable and separate support of the respective aperture element 109.2 and 109.3 on the support structure 110 has several advantages. One the one hand, due to the separate support of the respective aperture element 109.2 and 109.3 a design is achieved where none of the support devices 109.6 and 109.9 used to support the respective aperture element 109.2 and 109.3 obstructs the path of the exposure light provided by the light source of the illumination unit 102 through the aperture device 109. Consequently, no loss in radiant energy is caused by the support of the aperture elements 109.2 and 109.3.

In this case, in other words, a defined bundle of rays of light corresponding to the geometry of the aperture 109.1 is intended to pass the aperture 109.1 in a defined direction of radiation (e.g. parallel to the optical axis 101.1) with a defined average radiant power per area $P_{rel,av}$ in this direction of radiation. Furthermore, the inner contour 109.4 and the outer contour 109.5, in a plane perpendicular to this direction of radiation, define a ring shaped surface having a defined area A. The support of the aperture elements 109.2 and 109.3 as outlined above has the advantage that the radiant power P of this defined bundle of rays of light after passing the aperture 109.1 in this direction of radiation corresponds to the product of the average radiant power per area $P_{rel,av}$ and the defined area A of the ring shaped surface, i.e. it calculates as:

$$P = P_{rel,av} \cdot A. \tag{1}$$

In other words, as mentioned above, no undesired loss in radiant power is caused by the support of the components of the aperture stop 109 in the area of the aperture 109.1.

Furthermore, the separate releasable support of the respective aperture element 109.2 and 109.3 allows for an easy change in the geometry of the aperture 109.1. More precisely, each one of the first aperture element 109.2 and the second aperture element 109.3 may be easily exchanged by another suitable aperture element having a different geometry (e.g. provided from a corresponding magazine including a plurality of such aperture elements), thus modifying at least one of the geometry and the orientation of the respective aperture element. This allows an easy and fast modification of the geometry of the aperture 109.1 as it is indicated in FIG. 3 by the dashed contours 112.1 (e.g. resulting from an exchange of the inner aperture element 109.2) and 112.2 (e.g. resulting from an exchange of the outer aperture element 109.3).

In particular, contrary to the known designs with a single solid aperture plate (as it has been outlined above) by far lighter components (namely the first and second aperture element 109.2 and 109.3) have to be moved for changing the geometry of the aperture 109.1. Thus, the handling mechanism for exchanging the aperture elements 109.2 and 109.3 (not shown in further detail in FIGS. 1 to 3, e.g. a movable arm with a grasping mechanism for grasping the respective aperture element) may be of less complex and bulky design. This leads to a reduction in the handling and contamination risk, a less complex control and easier integration into the optical imaging apparatus 101.

Such handling mechanisms may be of any desired design and may execute an arbitrarly complex handling motion in space (e.g. an arbitrary combination of translatory and rotational motions). For example, there may be provided one single movable arm with a grasping mechanism which subsequently places the respective aperture element at the desired location. However, with other embodiments of the disclosure, it may also be provided that the handling mechanism places all the aperture elements to be placed at a time. Furthermore, separate handling mechanisms may be provided for the separate aperture elements. In particular, it may be provided that the separate aperture elements (e.g. the inner aperture element and the outer aperture element) are taken from separate storage devices.

It will be appreciated that the light source of the illumination unit 102, in the embodiment shown in FIGS. 1 to 3, provides a defined bundle of rays of light including a plurality of spatially confined sub-bundles separated by a non-irradiated area not being irradiated by the bundle of rays of light as it is difficult for so-called LPP (laser produced plasma) EUV light sources, for example. In the embodiment shown, a mirror element 111.1 is associated to each one of these sub-bundles.

However, it will be appreciated that, with other embodiments of the disclosure, a light source may be used providing a continuous bundle of rays of light not being separated into such individual spatially confined sub-bundles separated by non-irradiated areas. In this case, it is also possible that the optical element is a monolithic element (i.e. not composed of a plurality of spatially separated sub-elements) and that the respective aperture element, in particular the inner aperture element is directly supported on the optically used surface of the optical element.

It will be appreciated that, during an exposure process the aperture stop 109 absorbs a considerable amount of radiation energy provided by the light incident on the aperture stop 109. As a consequence, the temperature distribution within the aperture stop 109 successively changes due to the thermal energy introduced into the aperture stop 109 via the absorbed radiation energy. Typically, the part of the aperture stop 109 exposed to the incident light experiences a considerable increase in its temperature. This temperature increase leads to a thermal expansion of at least parts of the aperture stop 109 which (unless counteracted) in turn might lead to an undesired alteration of the relative position between the aperture edge 109.1 and the optical axis 101.1.

Thus, with preferred embodiments of the disclosure, passive and/or active thermal stabilization of the support structure 110 and the respective aperture element 109.2 and 109.3 may be provided (e.g. passive tempering/cooling elements such as tempering/cooling ribs etc or active tempering/cooling devices such as a tempering/cooling circuit etc).

For example, an active thermal balancing device in the form of an active temperature control circuit of the aperture stop 109 may be provided. Such an active temperature control circuit may for example use a fluidic coolant or electric cooling elements such as Peltier elements etc. Preferably, the temperature control circuit provides the temperature control via the support structure of 110 and the support devices 109.6 and 109.9.

Furthermore, it will be appreciated that, with other embodiments of the disclosure, the aperture stop 109 itself may be designed such that it prevents or reduces an alteration in the relative position of the aperture 109.1 with respect to the optical axis 101.1. For example, the aperture stop 109 may be made of a material having a near zero coefficient of thermal expansion (CTE), thus largely avoiding thermal expansion of the aperture stop 109. Such materials are for example Invar, Zerodur, etc.

Furthermore, it will be appreciated that, with other embodiments of the disclosure, the aperture stop itself may be designed such that it prevents or reduces an alteration in the relative position of the aperture 109.1 with respect to the optical axis 101.1 by avoiding or at least reducing a change in the temperature distribution within the aperture stop 109.

To this end, for example, passive thermal balancing device may be used providing improved heat removal from the aperture stop 109. Such a passive mechanism may be, for example, a suitable surface of the aperture stop 109 providing increased heat removal by providing increased radiation. Preferably such increased radiation is provided as directed radiation in order to avoid undesired heating of other temperature sensitive components of the imaging device 101.

With the optical exposure apparatus 101 of FIG. 1 a preferred embodiment of a method of shaping a light beam according to the disclosure may be executed as it will be described in the following with reference to FIGS. 1 to 4.

In a step 112.1, the components of the optical exposure device 101 as they have been described above are provided and put into a spatial relation to provide the configuration as it has been described in the context of FIGS. 1 to 3.

In a step 112.2, the optical exposure device 101 is used to expose one or several images of the pattern formed on the mask 104.1 onto the substrate 105.1 as it has been described above. During this step the aperture stop 109 shapes the bundle of rays of light passing it along the optical axis 101.1.

In a step 112.3, at least one of the inner aperture element 109.2 and the outer aperture element 109.3 is exchanged by another aperture element having a different geometry and/or orientation such that the geometry of the aperture 109.1 is changed. This change in the geometry of the aperture 109.1 leads to a different shape of the bundle of rays of light passing the aperture stop 109 as it has been outlined above.

Second Embodiment

In the following, a second embodiment of the optical module 206.1 according to the disclosure will be described with reference to FIG. 5. The optical module 206.1 in its basic design and functionality largely corresponds to the optical module 106.1 and may replace the optical module 106.1 in the optical imaging device 101 of FIG. 1. In particular, with the optical module 206.1 the method of shaping a bundle of rays of light as it has been described above in the context of the first embodiment (FIG. 4) may be executed. Thus, it is here mainly referred to the explanations given above and only the differences with respect to the optical module 106.1 will be explained in further detail. In particular, similar parts are given the same reference numeral raised by the amount 100 and (unless explicitly described in the following) in respect to these parts reference is made to the explanations given above in the context of the first embodiment.

The only difference with respect to the optical module 106.1 lies within the fact that the inner aperture element 209.2 of the aperture stop 209 is not directly supported on the support structure 210. Instead, the inner aperture element 209.2 is supported by the outer aperture element 209.3 via a plurality of strut elements 209.13 (here: three strut elements 209.13) extending in a radial direction in the plane of main extension defined by the aperture stop 209.

Figure 5:
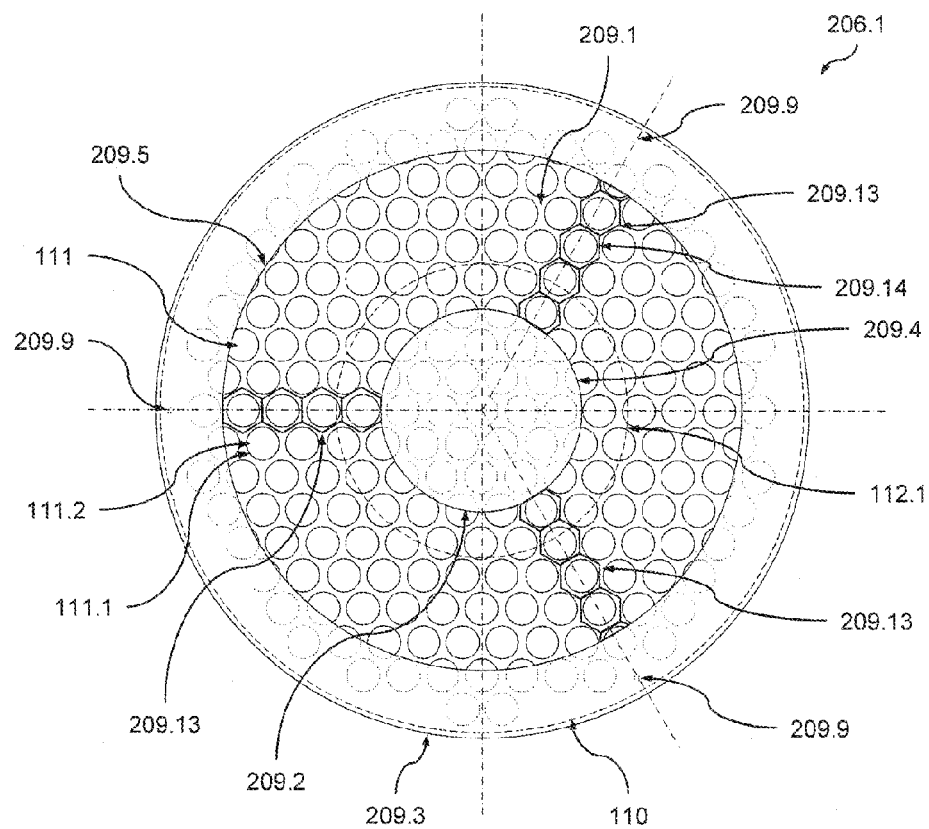
FIG. 5 is a schematic top view of a further preferred embodiment of an optical module according to the disclosure.

As can be seen from FIG. 5, the respective strut element 209.13 is formed by a plurality of honeycomb shaped elements 209.14 arranged and connected to each other in such a manner that they do not interfere with the sub-bundles of the bundle of rays of light provided by the light source of the illumination unit 102. More precisely, the wall sections of the honeycomb elements 209.14 are arranged such that they extend in the non-irradiated area located between the spatially confined sub-bundles of the bundle of rays light provided by the light source of the illumination unit 102. Thus, the strut elements 209.13 do not obstruct the path of the exposure light on its way through the aperture stop and, consequently, the support of the aperture elements 209.2 and 209.3 does not cause any loss in the radiant power.

The strut elements 209.13 are releaseably connected to the inner aperture element 209.2 and/or the outer aperture element 209.3. Thus, for example, the geometry and/or orientation of the aperture 209.1 may be easily modified (in the step 112.3 of FIG. 3) by releasing the connection between the strut elements 209.13 and the inner aperture element 209.2 and/or the outer aperture element 209.3 and by exchanging the inner aperture element 209.2 (eventually together with the strut elements 209.13) by another inner aperture element of different geometry and/or orientation.

It will be appreciated that the wall sections of the honeycomb elements 209.14 have a suitable defined dimension along the optical axis 101.1 in order to provide a sufficiently rigid support of the inner aperture element 209.2 along the optical axis 101.1.

It will be further appreciated that a different number of strut elements may be provided. Furthermore, the wall elements of the strut elements may be of any other suitable (at least section wise curved and/or angled) design as long as the do not interfere with the respective adjacent sub-bundles of rays of light.

It will be further appreciated that, with other embodiments of the disclosure, the inner aperture element and the outer aperture element may be connected via the strut elements (not interfering with the respective adjacent sub-bundles of rays of light) in a non-releasable manner (e.g. in a monolithic manner) such that the inner aperture element and the outer aperture element are exchanged together to modify the geometry of the aperture.

Third Embodiment

In the following, a third embodiment of the optical module 306.1 according to the disclosure will be described with reference to FIG. 6 and FIG. 7 (showing a schematic top view of a part of the optical module 306.1 corresponding to the section confined by the contour 112.1 in FIG. 3). The optical module 306.1 in its basic design and functionality largely corresponds to the optical module 106.1 and may replace the optical module 106.1 in the optical imaging device 101 of FIG. 1. In particular, with the optical module 306.1 the method of shaping a bundle of rays of light as it has been described above in the context of the first embodiment (FIG. 4) may be executed. Thus, it is here mainly referred to the explanations given above and only the differences with respect to the optical module 106.1 will be explained in further detail. In particular, similar parts are given the same reference numeral raised by the amount 200 and (unless explicitly described in the following) in respect to these parts reference is made to the explanations given above in the context of the first embodiment.

The difference with respect to the optical module 106.1 lies within the fact that the inner contour 309.4 of the aperture 309.1 is defined by a plurality of mutually overlapping first aperture elements 309.2. Each first aperture element 309.2 is a umbrella-like element that may be selectively transferred from a first state to a second state and back.

Figures 6, 7:
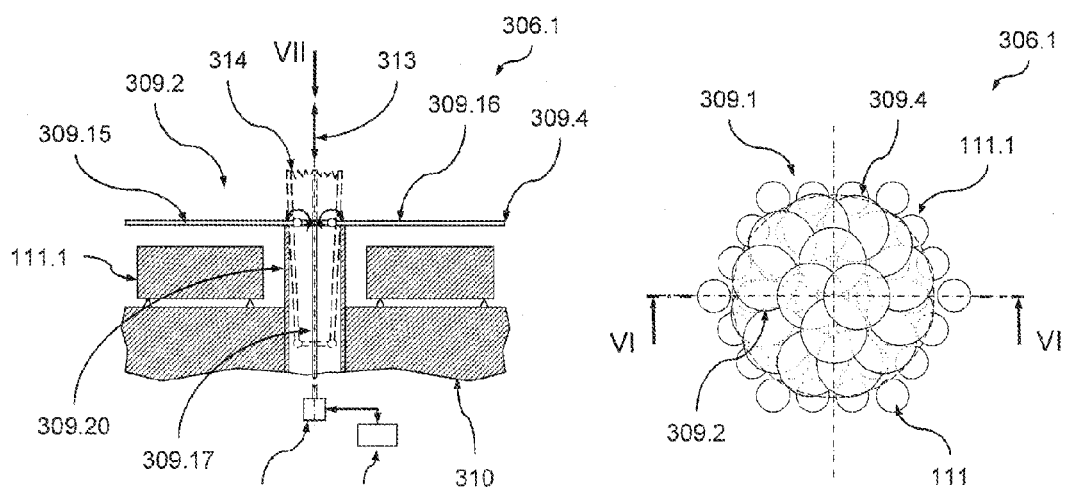
FIG. 6 is a schematic sectional view (along line VI-VI of FIG. 7) of a part of a further preferred embodiment of an optical module according to the disclosure.
FIG. 7 is a schematic top view of a part of the embodiment of FIG. 6 (seen along arrow VII of FIG. 6)

As can be seen from FIG. 6 (being a schematic sectional partial view in the region of one first aperture element 309.2) each umbrella-like aperture element 309.2 includes a plurality of ribs 309.15 interconnected by a thin and flexible sheet element 309.16. The ribs 309.15 are pivotably connected to a central rod 309.17 which in turn is connected to an actuating device 309.18 selectively moving the central rod 309.17 back and forth in the direction of arrow 313 under the control of the control device 309.19. The central rod 309.17 is arranged within a tubular receptacle 309.20 provided in the support structure 310 in a gap between adjacent mirror elements 111.1.

In the first state, each aperture element 309.2 is in an extended state where the ribs 309.15 are located outside the receptacle 309.20. In this first state, the ribs 309.15 (e.g. under the influence of spring force of a spring element not shown in further detail in FIGS. 6 and 7) are pivoted into a radial orientation such that the aperture element 309.2 unfolds in the manner of an umbrella (thereby placing the sheet element 309.16 under tension) and forms a substantially planar element of circular shape shielding a part of the reflective surface 111.3 of the mirror 111 from light incident along a line of propagation, e.g. along the optical axis 101.2. More precisely, the aperture element 309.2 in this first state mainly extends a plane substantially perpendicular to the optical axis 101.1 and shields the part of the reflective surface 111.3 that is formed by the mirror elements 111.1 spanned by the first aperture element 309.2.

In the second state, each aperture element 309.2 is in a retracted state where the ribs 309.15 (together with the sheet element 309.16) are folded back and retracted into the receptacle 309.20 (see dashed contour 314 of FIG. 6). In this second state, the aperture element 309.2 gives way such that it does not shield any of the mirror elements from incident light.

In order to modify the geometry of the aperture 309.1 (in the step 112.3 of FIG. 4), under the control of the control device 309.19, a suitable number of first aperture elements 309.2 is successively unfolded (preferably one after the other), i.e. transferred from its second state to its first state, in order to provide a mutually overlapping arrangement as it is shown in FIG. 7, for example. If a different geometry of the aperture 309.1 is to be provided, another number of first aperture elements 309.2 (eventually having a different location) is brought into the first state.

It will be appreciated that the first aperture elements 309.2 may be distributed over the entire optical module 306.1 such that virtually any desired geometry of the aperture 309.1 may be achieved. In particular, arbitrary circular or annular configurations of the aperture 309.1 may be achieved where the outer contour of the aperture is defined by the respective aperture elements 309.2.

It will be appreciated that, with this embodiment as well, the support to the respective aperture element 309.2 does not obstruct the path of the exposure light through the aperture 309.1 such that no loss in radiant power is caused by the support to the respective aperture element 309.2. Furthermore, this embodiment provides a rather simple possibility to selectively modify the geometry of the aperture without having to move large masses. This solution provides a high flexibility and very short reaction times for changes in the setting of the aperture. Furthermore, only very little space is involved to implement this solution.

It will be further appreciated that, with other embodiments of the disclosure, any other configuration may be chosen providing such a selectively folding and unfolding design. In particular, the flexible sheet element may be replaced by a plurality of substantially rigid elements each one connected to one of the ribs. In this case, of course, a suitable shape of the receptacle has to be chosen.

Fourth Embodiment

In the following, a fourth embodiment of the optical module 406.1 according to the disclosure will be described with reference to FIG. 8. The optical module in its basic design and functionality largely corresponds to the optical module 106.1 and may replace the optical module 106.1 in the optical imaging device 101 of FIG. 1. In particular, with the optical module 406.1 the method of shaping a bundle of rays of light as it has been described above in the context of the first embodiment (FIG. 4) may be executed. Thus, it is here mainly referred to the explanations given above and only the differences with respect to the optical module 106.1 will be explained in further detail. In particular, similar parts are given the same reference numeral raised by the amount 300 and (unless explicitly described in the following) in respect to these parts reference is made to the explanations given above in the context of the first embodiment.

The difference with respect to the optical module 106.1 lies within the fact that the aperture stop 409 is made of a plurality of aperture elements 409.2. A defined number of aperture elements 409.2 is associated to one of a plurality of the mirror elements 111.1 of the mirror 111. Preferably, a defined number of aperture elements 409.2 is associated to each one of the mirror elements 111.1.

Figure 8:
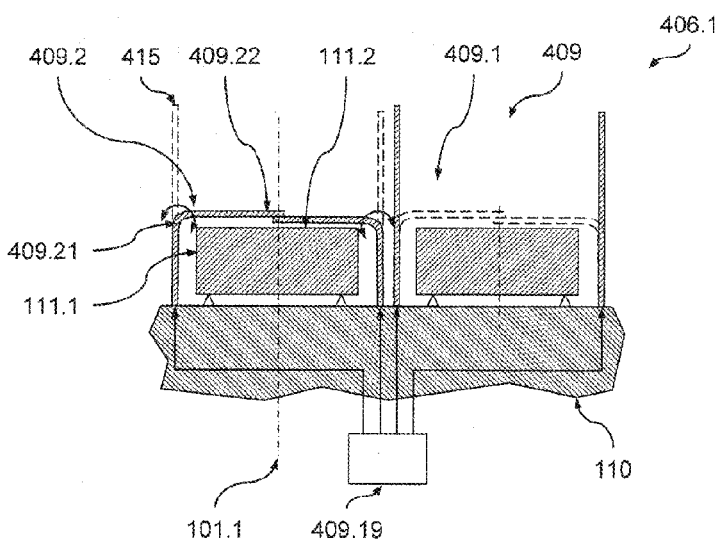
FIG. 8 is a schematic sectional view of a part of a further preferred embodiment of an optical module according to the disclosure.

As can be seen from FIG. 8 (being a schematic partial sectional view in the region of two mirror elements 111.1) aperture element 409.2 is formed by an elongated element partially extending in the gap between two adjacent mirror elements 111.1 and having an active bending section 409.21 which may be transferred, under the control of a control unit 409.19 from a bent (first) state to a straight (second) state. To this end, the bending section 409.21 may be formed from any material or material combination providing such an active control of its geometry. For example, a shape memory or other active material or material combination may be used which is transferred between the first state and the second state depending on an external field (e.g. a thermal field and/or an electric field and/or a magnetic field) established in the region of the bending section 409.21.

In the first state, each aperture element 409.2 is in a bent state where the free end part 409.22 of the aperture element 409.2 is shielding a part of the reflective surface 111.2 of the associated mirror element 111.1 from light incident along a line of propagation, e.g. along the optical axis 101.2. More precisely, the free end part 409.22 in this first state mainly extends a plane substantially perpendicular to the optical axis 101.1 and shields a part of the reflective surface 111.3 that is formed by the respective mirror elements 111.1 spanned by the free end part 409.22. The number and shape of the aperture elements 409.2 associated to the respective mirror element 111.1 is selected such that the reflective surface 111.2 of the respective mirror element 111.1 is fully shielded in the first state of the aperture elements 409.2.

In the second state, each aperture element 409.2 is in a straightened state where the bending section 409.21 is straightened (see the dashed contour 415 of FIG. 8). In this second state, the aperture element 309.2 gives way such that it does not shield the mirror element 111.1 from incident light along the line of propagation.

In order to modify the geometry of the aperture 409.1 (in the step 112.3 of FIG. 4), under the control of the control device 409.19, a suitable number of first aperture elements 409.2 is selectively transferred from its second state to its first state, in order to selectively shield the respective mirror element 111.1 from incident light.

It will be appreciated that the aperture elements 409.2 may be distributed over the entire optical module 406.1 such that virtually any desired geometry of the aperture 409.1 may be achieved. In particular, arbitrary circular or annular configurations of the aperture 409.1 may be achieved where the outer contour of the aperture is defined by the respective aperture elements 409.2.

It will be further appreciated that, with other embodiments of the disclosure, the aperture elements may be entirely formed by the bending section, i.e. deform over their entire length. Furthermore, each aperture element may include a plurality of such actively (eventually selectively) deformable sections in order to be able to provide a desired trajectory of the deformation.

It will be appreciated that, with this embodiment as well, the support to the respective aperture element 409.2 does not obstruct the path of the exposure light through the aperture 409.1 such that no loss in radiant power is caused by the support to the respective aperture element 409.2. Furthermore, this embodiment provides a rather simple possibility to selectively modify the geometry of the aperture without having to move large masses. This solution provides a high flexibility and very short reaction times for changes in the setting of the aperture since all mirror elements 111.1 desired to be shielded may be shielded at a time. Furthermore, only very little space is involved to implement this solution.

Fifth Embodiment

In the following, a fifth embodiment of an optical module 506.1 according to the disclosure will be described with reference to FIGS. 9 to 11. The optical module 506.1 in its basic design and functionality largely corresponds to the optical module 106.1 and may replace the optical module 106.1 in the optical imaging device 101 of FIG. 1. In particular, with the optical module 506.1 the method of shaping a bundle of rays of light as it has been described above in the context of the first embodiment (FIG. 4) may be executed. Thus, it is here mainly referred to the explanations given above and only the differences with respect to the optical module 106.1 will be explained in further detail. In particular, similar parts are given the same reference numeral raised by the amount 400 and (unless explicitly described in the following) in respect to these parts reference is made to the explanations given above in the context of the first embodiment.

Figure 9:
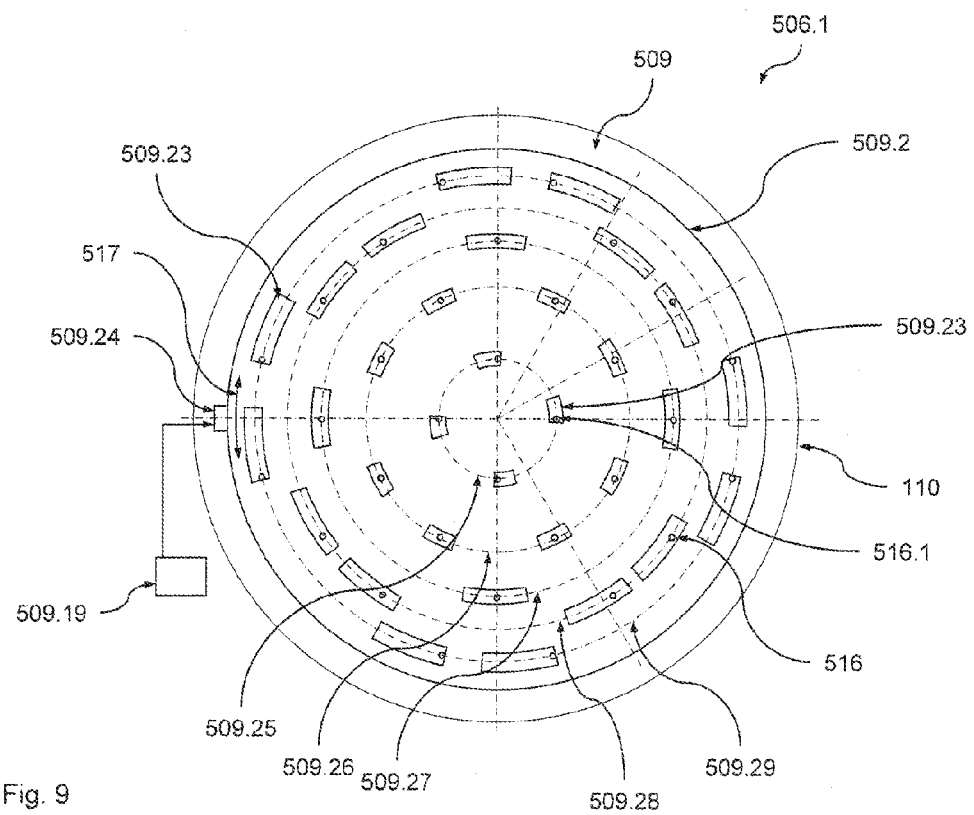
FIG. 9 is a schematic top view of a part of a further preferred embodiment of an optical module according to the disclosure in a first state.

As may be seen from FIG. 9 (being a highly schematic top view of the optical module 506.1 similar to the view of FIG. 3) the aperture stop 509 is formed by a planar, substantially plate shaped aperture element 509.2 which is rotatably supported on the support structure 110. The aperture element 509.2 includes a plurality of recesses in the form of slots 509.23 extending through the aperture element 509.2 and forming a passageway for light passing the aperture stop 509. Each of the slots 509.23 is associated to one of the spatially confined sub-bundles 516.1 of the bundle 516 of rays of light provided by the light source of the illumination unit 102.1. The sub-bundles 516.1 are evenly distributed and separated by non-irradiated areas as it has been described above.

In the circumferential direction 517 of the aperture stop, the slots have an arcuate design which is substantially concentric to the axis of rotation of the aperture element 509.2. This axis of rotation of the aperture element 509.2 may coincide with the optical axis 101.1. However, with other embodiments of the disclosure, any other suitable and desired orientation of the axis of rotation of the aperture element with respect to the optical axis 101.1 may be chosen.

The aperture element 509.2, under the control of a control unit 509.19, may be driven (clockwise and counterclockwise) along the circumferential direction 517 via a drive unit 509.24 connected to the control unit 509.19 and supported on the support structure 110. In the state shown in FIG. 9 the slots 509.23 of the aperture element 509.2 are arranged such that none of the sub-bundles 516.1 is blocked by the aperture element 509.2, i.e. all the sub-bundles 516.1 of the bundle 516 can pass the aperture element 509.2 in their direction of propagation.

Figures 10, 11:
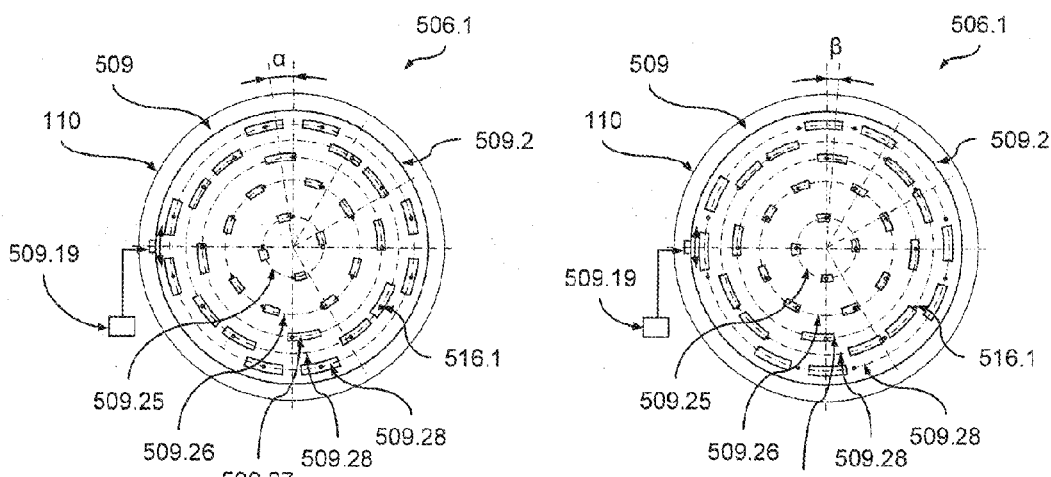
FIG. 10 is a schematic top view of the optical module of FIG. 9 in a second state.
FIG. 11 is a schematic top view of the optical module of FIG. 9 in a third state.

In the state shown in FIG. 10 the aperture element 509.2 has been rotated (with respect to the state shown in FIG. 9)

counterclockwise by a given angle α. In this state the slots 509.23 arranged on the inner two slot circles 509.25 and 509.26 are located such that the associated sub-bundles 516.1 may not pass them any more while the other slots 509.23 arranged on the outer three slot circles 509.27 to 509.29 are located such that the associated sub-bundles 516.1 may still pass them. Thus, the aperture 509.1 provided by the aperture element 509.2 has an annular shape in this state shown in FIG. 10.

In other words, in this state, the part of the aperture element 509.2 located in the region of the inner two slot circles 509.25 and 509.26 may be considered as an inner aperture element which is supported via the (monolithically connected) part of the aperture element 509.2 located in the region of the outer three slot circles 509.27 to 509.29 on the part forming the outer circumference of the aperture element 509.2.

In the state shown in FIG. 11 the aperture element 509.2 has been rotated (with respect to the state shown in FIG. 9) clockwise by a given angle β. In this state the slots 509.23 arranged on the outer two slot circles 509.28 and 509.29 are located such that the associated sub-bundles 516.1 may not pass them any more while the other slots 509.23 arranged on the inner three slot circles 509.25 to 509.27 are located such that the associated sub-bundles 516.1 may still pass them. Thus, the aperture 509.1 provided by the aperture element 509.2 has a circular shape in this state shown in FIG. 11.

It will be appreciated that, with this embodiment as well, in the respective state, the support to the respective parts of the aperture element 509.2 does not obstruct the path of the exposure light through the aperture 509.1 such that no loss in radiant power is caused by the support to the respective parts of the aperture element 509.2.

Furthermore, this embodiment provides a very simple possibility to selectively modify the geometry of the aperture without having to move large masses along a complicated trajectory. Instead, only a simple rotation is involved to modify the geometry of the aperture 509.1. This solution provides very short reaction times for changes in the setting of the aperture since only a small angle of rotation may be sufficient to provide a change to the desired setting.

It will be further appreciated that the aperture slots 509.23 may be arranged such that they provide virtually any desired geometry of the aperture 509.1. Furthermore, it will be appreciated that the aperture element 509.2 may be used in connection with any desired optical element. In other words, this solution is not limited to an implementation in connection with the segmented mirror 111 as it has been described above. Rather any type of optical element may be associated to the aperture element 509.2.

Furthermore, since the aperture element 509.2 does not necessitate any support apart from a support at its outer circumference, it is not necessary to provide a close spatial relation between the aperture element 509.2 and an optical element. Rather, the optical module 506.1 may only include the aperture element 509.2 and no optical element supported by the support structure of the aperture element 509.2. In this case, obviously, the support structure of the aperture element 509.2 may have an annular design not obstructing the part of the light passing the aperture element 509.2. In particular, the aperture element 509.21 may for example be used in the optical module 108 of the optical projection unit 103 of FIG. 1.

Sixth Embodiment

In the following, a sixth embodiment of an optical module 606.1 according to the disclosure will be described with reference to FIG. 12. The optical module 606.1 in its basic design and functionality largely corresponds to the optical module 506.1 and may replace the optical module 106.1 in the optical imaging device 101 of FIG. 1. In particular, with the optical module 606.1 the method of shaping a bundle of rays of light as it has been described above in the context of the first embodiment (FIG. 4) may be executed. Thus, it is here mainly referred to the explanations given above and only the differences with respect to the optical module 506.1 will be explained in further detail. In particular, similar parts are given the same reference numeral raised by the amount 100 and (unless explicitly described in the following) in respect to these parts reference is made to the explanations given above in the context of the first embodiment.

Figure 12:
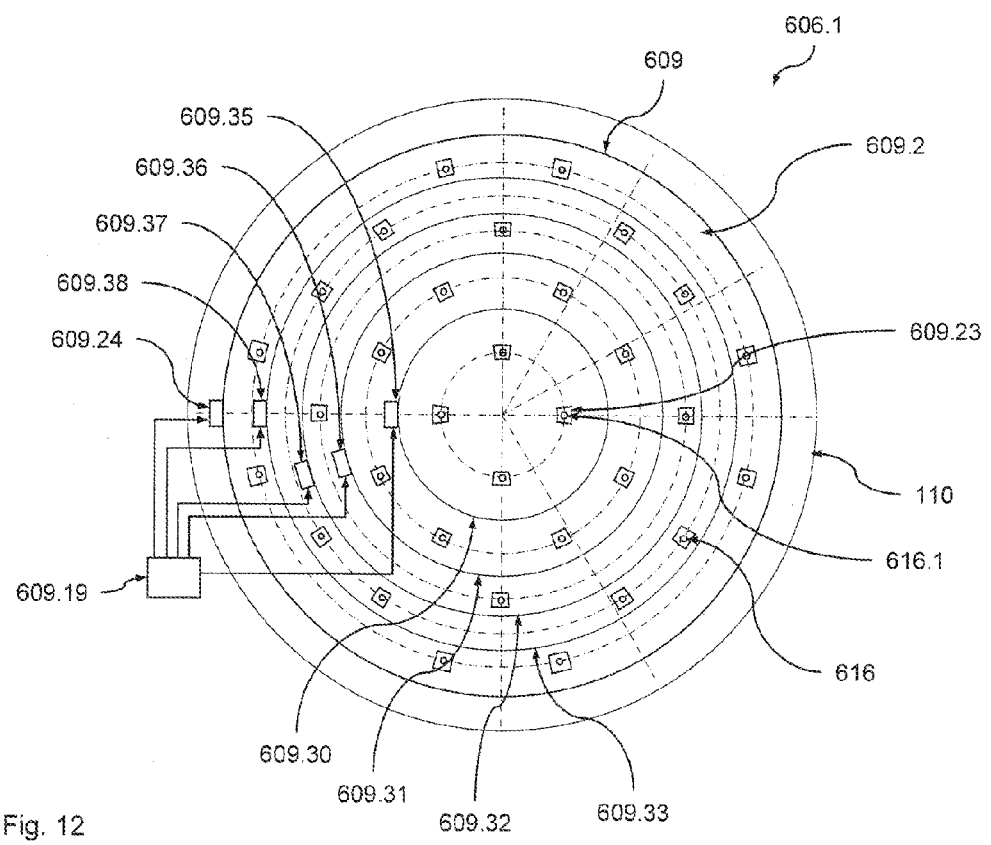
FIG. 12 is a schematic top view of a further preferred embodiment of an optical module according to the disclosure.

As may be seen from FIG. 12 (being a highly schematic top view of the optical module 606.1 similar to the view of FIG. 3) the aperture stop 609 is formed by a plurality of planar aperture elements 609.30 to 609.34 which are rotatably supported on the support structure 110. The circular aperture element 609.30 and the annular aperture elements 609.31 to 609.34 are arranged to be concentric to the axis of rotation of the aperture stop 609. Each one of the aperture elements 609.30 to 609.34 supports the adjacent more inward one of the aperture elements 609.30 to 609.34.

Each aperture element 609.30 to 609.34 includes a plurality of recesses in the form of slots 609.23 extending through the aperture element 609.2 and forming a passageway for light passing the aperture stop 609. Each of the slots 609.23 is associated to one of the spatially confined sub-bundles 516.1 of the bundle 516 of rays of light provided by the light source of the illumination unit 102.1. The sub-bundles 516.1 are evenly distributed and separated by non-irradiated areas as it has been described above.

In the circumferential direction 617 of the aperture stop, the slots have an arcuate design which is substantially concentric to the axis of rotation of the aperture stop 609. This axis of rotation of the aperture stop 609 may coincide with the optical axis 101.1. However, with other embodiments of the disclosure, any other suitable and desired orientation of the axis of rotation of the aperture stop with respect to the optical axis 101.1 may be chosen.

Under the control of a control unit 609.19, each aperture element 609.30 to 609.34 may be individually driven (clockwise and counterclockwise) along the circumferential direction 617 via an associated drive unit 609.24 and 609.35 to 609.38 connected to the control unit 609.19 and supported on the adjacent more outward one of the aperture elements 609.30 to 609.34 and the support structure 110, respectively. In the state shown in FIG. 12 the slots 609.23 of the aperture element 609.2 are arranged such that none of the sub-bundles 516.1 is blocked by the aperture element 609.2, i.e. all the sub-bundles 516.1 of the bundle 516 can pass the aperture element 609.2 in their direction of propagation.

It will be appreciated that the aperture elements 609.30 to 609.34 may be individually driven to provide any desired annular or circular shape of the aperture 609.1. In particular, also multiple annular shapes of the aperture 609.1 may be provided.

It will be appreciated that, with this embodiment as well, in the respective state, the support to the respective parts of the aperture elements 609.30 to 609.34 does not obstruct the path of the exposure light through the aperture 609.1 such that no loss in radiant power is caused by the support to the respective parts of the aperture element 609.30 to 609.34. Furthermore, this embodiment provides a very simple possibility to selectively modify the geometry of the aperture without having to move large masses along a complicated trajectory. Instead, only a simple rotation is involved to modify the geometry of the aperture 609.1. This solution provides very short reaction times for changes in the setting of the aperture since only a small angle of rotation may be sufficient to provide a change to the desired setting.

It will be further appreciated that the aperture slots 609.23 may be arranged and designed such that they provide virtually any desired geometry of the aperture 609.1. Furthermore, it will be appreciated that the aperture element 609.2 may be used in connection with any desired optical element. In other words, this solution is not limited to an implementation in connection with the segmented mirror 111 as it has been described above. Rather any type of optical element may be associated to the aperture element 609.2.

Furthermore, since the aperture element 609.2 does not necessitate any support apart from a support at its outer circumference, it is not necessary to provide a close spatial relation between the aperture element 609.2 and an optical element. Rather, the optical module 606.1 may only include the aperture element 609.2 and no optical element supported by the support structure of the aperture element 609.2. In this case, obviously, the support structure of the aperture element 609.2 may have an annular design not obstructing the part of the light passing the aperture element 609.2. In particular, the aperture element 609.21 may for example be used in the optical module 108 of the optical projection unit 103 of FIG. 1.

In the foregoing, the disclosure has been described in the context of a plurality of embodiments where a first and a second aperture element were used to shape a bundle of light. It will be appreciated in this context that, with the other embodiments of the disclosure, an arbitrary number of further aperture elements may be used in addition to this first and second aperture element in order to shape a bundle of light. In particular, by this approach, the aperture may be provided with a geometry having a plurality of inner contours such as it is the case for example for a bipole or quadrupole annular setting.

In the foregoing, the disclosure has been described in the context of embodiments where the optical module according to the disclosure is used in the illumination unit. However, it will be appreciated that the optical module according to the disclosure may provide its beneficial effects as well in the optical projection unit.

In the foregoing, the disclosure has been described in the context of embodiments working in the EUV range. However, it will be appreciated that the disclosure may also be used at any other wavelength of the exposure light, e.g. in systems working at 193 nm etc.

Although, in the foregoing, the disclosure has been described solely in the context of microlithography systems. However, it will be appreciated that the disclosure may also be used in the context of any other optical device using aperture devices.

What is claimed is:

1. An optical module, comprising:
an aperture device comprising a plurality of aperture elements which define an opening in the aperture device configured so that during use of the optical module a first portion of light impinging on the aperture device is blocked by the aperture device and a second portion of light impinging on the aperture device passes through the opening of the aperture device,
wherein:
the plurality of aperture elements define a geometry of an aperture;
the plurality of aperture elements comprise a first aperture element and a second aperture element;
at least the first and second aperture elements, in one state of the aperture device, define a ring shaped geometry of the aperture;
the aperture device is configured to modify a parameter of the first aperture element independently of the second aperture element;
the modification of the first aperture element resulting in a modification of the geometry of the aperture; and
the parameter comprises at least one parameter selected from the group consisting of a position of the first aperture element with respect to the second aperture element and an orientation of the first aperture element with respect to the second aperture element.

2. The optical module according to claim 1, wherein:
the first aperture element is removable;
to modify the geometry of the aperture, the aperture device is configured to remove the first aperture element and/or exchange the first aperture element with a third aperture element.

3. The optical module according to claim 1, further comprising an optical element unit, the optical element unit comprising an optical element, wherein:
the optical element unit is adjacent the aperture device;
the first aperture element is supported by the optical element unit; and
the first aperture element is configured to shield at least a part of an optically used surface of the optical element from incident light when being supported on the optical element unit.

4. The optical module according to claim 3, wherein:
the optical element unit comprises a support structure supporting the optical element; and
the first aperture element is supported on the support structure via a support device and/or the first aperture is locked in position with respect to the support structure via a locking device.

5. The optical module according to claim 4, wherein:
the optical element unit comprises a plurality of optical elements;
the support structure supporting the plurality of optical elements; and
the first aperture element is supported on the support structure via a support element extending in a gap between two of the optical elements.

6. The optical module according to claim 4, wherein the support structure comprises a receptacle adjacent to the optical element, and wherein the first aperture element, in the second state, is in a retracted state wherein the first aperture element is at least partly received with in the receptacle.

7. The optical module according to claim 1, wherein:
the first aperture element is configured to be transferred from a first state to a second state;
the aperture has a first geometry in the first state;
the aperture has a second geometry in the second state; and
the second geometry is different from the first geometry.

8. The optical module according to claim 7, wherein:
the first aperture element is movable; and
when the first aperture element is transferred between the first state and the second state, a position of the first aperture element is altered and/or an orientation of the first aperture element is altered.

9. The optical module according to claim 8, further comprising an actuating device, wherein the actuating device is connected to the first aperture element, and the actuating device is configured to transfer the first aperture element between the first state and the second state.

10. The optical module according to claim 8, further comprising an optical element unit, wherein:
the optical element unit comprises an optical element adjacent the first aperture element;
In the first state, the first aperture element is configured to shield at least a part of an optically used surface of the optical element from incident light propagating along a line of propagation;
the first aperture element has a recess; and
in the second state, the recess is located so that the incident light propagating along the line of propagation hits the part of the optically used surface shielded in the first state.

11. The optical module according to claim 10, wherein:
the first aperture element defines a plane of main extension;
the plane of main extension extends transverse to the line of propagation;
the first aperture element is rotated about an axis of rotation when being transferred between the first state and the second state; and
the axis of rotation extending transverse to the plane of main extension.

12. The optical module according to claim 11, wherein the first aperture element has a circular shape or an annular shape.

13. The optical module according to claim 10, wherein:
the optical element unit comprises at least one optical element located adjacent the first aperture element;
the first aperture element has a first recess and a second recess;
in the first state, the first aperture element is configured to shield at least a first part of an optically used surface of the at least one optical element from a first beam of incident light propagating along a first line of propagation;
in the second state, the first recess is located so that the first beam of incident light hits the first part of the optically used surface shielded in the first state;
in the second state, the first aperture element is configured to shield at least a second part of the optically used surface from a second beam of incident light propagating along a second line of propagation; and
in the first state, the second recess is located so that the second beam of incident light hits the second part of the optically used surface shielded in the second state.

14. The optical module according to claim 7, wherein the first aperture element is deformable, and the first aperture element is configured to undergo a deformation when being transferred between the first state and the second state.

15. The optical module according to claim 14, wherein the first aperture element comprises an active element, and the active element is configured to induce at least a part of the deformation of the first aperture element when subject to at least one field selected from the group consisting of an electric field, a magnetic field and a thermal field.

16. The optical module according to claim 7, further comprising a control device configured to control transfer between the first state and the second state.

17. The optical module according to claim 7, further comprising an optical element unit, wherein:
the optical element unit comprises an optical element adjacent the first aperture element;
the first aperture element is supported by the optical element unit; and in the first state, the first aperture element is configured to shield at least a part of an optically used surface of the optical element from incident light.

18. The optical module according to claim 1, further comprising a plurality of the first aperture elements.

19. The optical module according to claim 1, wherein:
the plurality of aperture elements further comprises at least a third aperture element; and
in the one state of the aperture device, the plurality of aperture elements define a ring shaped geometry of the aperture.

20. An optical imaging arrangement, comprising:
an illumination unit; and
an optical projection unit,
wherein:
the illumination unit comprises the optical module according to claim 1 and/or the optical projection unit comprises the optical module according to claim 1; and
the optical imaging arrangement is configured for microlithography.

21. A method, comprising:
providing a bundle of light and a plurality of aperture elements which define an opening in the aperture device configured so that during use of the optical module a first portion of light impinging on the aperture device is blocked by the aperture device and a second portion of light impinging on the aperture device passes through the opening of the aperture device, the plurality of aperture elements defining a geometry of an aperture and comprising a first aperture element and a second aperture element;
shaping the bundle of light using the aperture; and
modifying a position and/or an orientation of the first aperture element independently of the second aperture element, the modification of the position and/or orientation of the first aperture element being with respect to the second aperture element to modify the geometry of the aperture shaping the bundle of light,
wherein, in one state of the aperture device, at least the first and second aperture elements define a ring shaped geometry of the aperture.

22. An optical module, comprising:
an optical element comprising a plurality of optical sub-elements,
an aperture device comprising a plurality of aperture elements which define an opening in the aperture device configured so that during use of the optical module a first portion of light impinging on the aperture device is blocked by the aperture device and a second portion of light impinging on the aperture device passes through the opening of the aperture device, and
a support structure supporting at least some of the optical sub-elements,
wherein:
the plurality of aperture elements define a geometry of an aperture;
the plurality of aperture elements comprise a first aperture element and a second aperture element;
the first aperture element being supported by a first support device of the support structure;
the second aperture element being supported by a second support device of the support structure;
the first support device is different from the second support device;

in a first state of the aperture device, the first aperture element defines an inner contour of an aperture having a ring shaped geometry;

in a first state of the aperture device, the second aperture element defines an outer contour of the aperture.

23. The optical module of claim 22, wherein the support structure supports all the optical sub-elements.

24. The optical module of claim 22, wherein the optical element comprises a mirror.

25. The optical module of claim 24, wherein the optical sub-elements comprise mirror elements.

26. The optical module of claim 22, wherein the optical element is between the aperture device and the support structure.

* * * * *

UNITED STATES PATENT AND TRADEMARK OFFICE
CERTIFICATE OF CORRECTION

| | | |
|---|---|---|
| PATENT NO. | : 8,687,169 B2 | Page 1 of 1 |
| APPLICATION NO. | : 12/894890 | |
| DATED | : April 1, 2014 | |
| INVENTOR(S) | : Hermann Bieg and Uy-Liem Nguyen | |

It is certified that error appears in the above-identified patent and that said Letters Patent is hereby corrected as shown below:

Title Page, Item (73), line 1, delete "Oberkocken" and insert -- Oberkochen --.

In the Drawings:

Sheet 1 of 5 (FIG. 2), line 3 (approx.), delete "110." and insert -- 110 --.

In the Specification:

Col. 11, line 13, delete "the" and insert -- they --.

Signed and Sealed this
Seventeenth Day of June, 2014

Michelle K. Lee
*Deputy Director of the United States Patent and Trademark Office*